United States Patent
Boivin

(10) Patent No.: US 11,114,614 B2
(45) Date of Patent: Sep. 7, 2021

(54) PROCESS FOR FABRICATING RESISTIVE MEMORY CELLS

(71) Applicant: STMicroelectronics (Rousset) SAS, Rousset (FR)

(72) Inventor: Philippe Boivin, Venelles (FR)

(73) Assignee: STMicroelectronics (Rousset) SAS, Rousset (FR)

(*) Notice: Subject to any disclaimer, the term of this patent is extended or adjusted under 35 U.S.C. 154(b) by 139 days.

(21) Appl. No.: 16/400,649

(22) Filed: May 1, 2019

(65) Prior Publication Data

US 2019/0259942 A1 Aug. 22, 2019

Related U.S. Application Data

(62) Division of application No. 15/352,985, filed on Nov. 16, 2016, now Pat. No. 10,319,906.

(30) Foreign Application Priority Data

May 2, 2016 (FR) ...................................... 1653940

(51) Int. Cl.
*H01L 45/00* (2006.01)
*H01L 27/24* (2006.01)

(52) U.S. Cl.
CPC ........ *H01L 45/122* (2013.01); *H01L 27/2463* (2013.01); *H01L 45/1233* (2013.01); *H01L 45/146* (2013.01); *H01L 45/16* (2013.01); *H01L 45/1675* (2013.01)

(58) Field of Classification Search
CPC ..... H01L 45/12; H01L 45/122; H01L 45/123; H01L 45/1233; H01L 45/14; H01L 45/146; H01L 45/16; H01L 45/167; H01L 45/1675; H01L 27/24; H01L 27/246; H01L 27/2463
USPC ........................................................ 257/4, 7
See application file for complete search history.

(56) References Cited

U.S. PATENT DOCUMENTS

| 8,384,061 | B2 * | 2/2013 | Mikawa | ................. H01L 45/04 257/4 |
|---|---|---|---|---|
| 8,766,090 | B2 | 7/2014 | Sewell et al. | |
| 9,431,108 | B2 | 8/2016 | Battista et al. | |
| 2007/0201264 | A1 | 8/2007 | Shin et al. | |
| 2008/0121858 | A1 | 5/2008 | Kurahashi et al. | |
| 2010/0102290 | A1 | 4/2010 | Lu et al. | |

(Continued)

FOREIGN PATENT DOCUMENTS

| CN | 1581488 A | 2/2002 |
|---|---|---|
| CN | 1612349 A | 5/2005 |

*Primary Examiner* — Monica D Harrison
(74) *Attorney, Agent, or Firm* — Seed IP Law Group LLP

(57) ABSTRACT

A oxide-based direct-access resistive nonvolatile memory may include within the interconnect portion of the integrated circuit a memory plane including capacitive memory cells extending in orthogonal first and second directions and each including a first electrode, a dielectric region and a second electrode. The memory plane may include conductive pads of square or rectangular shape forming the first electrodes. The stack of the dielectric layer and the second conductive layer covers the pads in the first direction and forms, in the second direction, conductive bands extending over and between the pads. The second electrodes may be formed by zones of the second bands facing the pads.

20 Claims, 4 Drawing Sheets

(56) References Cited

U.S. PATENT DOCUMENTS

2012/0313068 A1  12/2012  Sakotsubo
2014/0078808 A1   3/2014  Hashim et al.
2015/0187842 A1   7/2015  Cho

* cited by examiner

PROCESS FOR FABRICATING RESISTIVE MEMORY CELLS

TECHNICAL FIELD

This disclosure relates to memory devices, and more particularly, to nonvolatile resistive memories.

BACKGROUND

Resistive memories (RRAM), such as oxide-based direct-access memories (OxRAM), electrolytic memories (CBRAM), or even ferromagnetic memories (FRAM), have many advantages and attributes. These include very short read and write times, low operating voltages, low power consumption, easy integration, an almost infinite endurance and a potentially very high density.

RRAM resistive memories typically include memory points capable of storing one bit, which points are distributed in rows and columns in a matrix array in a memory plane. A memory point is accessed via word lines traversing the rows of the memory plane and bit lines traversing the columns of the memory plane.

In RRAM resistive memories, each memory point usually includes a capacitive metal-oxide-metal (MOM) structure or memory cell. The metal layers of the capacitive MOM structure form top and bottom electrodes, which are placed on either side of a dielectric layer and may be metal oxide, for example.

Since they include oxide and metals, the capacitive memory cells may advantageously be fabricated in the interconnect portion of an integrated circuit. This portion is located above the substrate and usually designated in the art by the acronym BEOL (back-end of line).

The processes for fabricating a RRAM resistive memory utilize conventional photolithography steps, in which a layer of photoresist deposited on the structure being formed is irradiated in a desired pattern. Next, the resist that was irradiated (or that was not radiated) is removed to form a resist mask to etch the exposed portion of the structure through the resist mask.

FIG. 1 illustrates a conventional resist mask deposited on a resistive-memory memory plane PM during the manufacturing process, as seen from above. The resist mask includes "pads" 11 of square shape, periodically repeated in the directions of the rows X and the columns Y of the memory plane PM. The pads 11 eventually define the dimensions of the capacitive cells CEL.

In the photolithography steps, the projected images appear with irregularities, such as rounded corners. Furthermore, despite the implementation of optical proximity corrections (OPCs), the square portions of the resist have a tendency to round at their corners and to end up becoming circular, as shown by the dotted lines 12. Therefore, the area on which the resist pads rest decreases.

The smaller the area, the more the adhesion of the resist becomes problematic, and the greater the risk that debonding will generate severe fabrication defects. Thus, the densification of RRAM type memories may be limited by this problem of adhesion of the photoresist.

SUMMARY

Therefore, according to an example method of implementation, a process is provided for forming a RRAM resistive-memory memory cell or memory plane, allowing the size of the memory points to be decreased without the above-noted adhesion problem. This makes it possible to increase the density of the RRAM memory and also to control the aspect ratio of the cells produced.

According to one aspect, a process is proposed for producing at least one capacitive memory cell including a first electrode and a second electrode separated by a dielectric region, within an interconnect portion of an integrated circuit.

According to one example aspect, the process may include a first etching step in which, in a first conductive layer, a first band extending in a first direction is formed. The method further includes forming, on the etched first conductive layer, a dielectric layer and a second conductive layer. In a second etching step, in the second conductive layer, the dielectric layer and the etched first conductive layer, a second band extending in a second direction orthogonal to the first direction is formed. The first electrode may be formed by the intersection, in the first conductive layer, of the first band and the second band. The second electrode may be formed by the zone or portion of the second conductive layer facing the first electrode.

According to one example implementation applicable to the production of a resistive-memory memory plane, within the interconnect portion of the integrated circuit, a plurality of capacitive memory cells are formed. The formation of the first electrodes of the memory cells may include the first etching step in which, in the first conductive layer, first bands extending in the first direction are etched and the second etching step in which, in the second conductive layer, the dielectric layer and the etched first conductive layer, second bands extending in the second direction are etched. The second electrodes of the memory cells may be formed by zones of the second bands facing the first electrodes.

This process, which uses bands to form one or more memory cells, makes it possible to preserve the aspect ratio of the generally square or rectangular memory cell(s).

According to one example implementation, the first bands and the second bands may be periodically distributed in the memory plane with a regular pitch in each of the two directions.

In accordance with another example aspect, the first and second etching steps may include depositing a photoresist followed by a photolithography step. The resist masks rest on larger areas than in conventional methods of implementation. Thus, this aspect responds to the problem of adhesion of the resist and advantageously allows the density of RRAM resistive memories to be increased.

The process may further include forming word lines traversing the memory plane in the first direction and bit lines traversing the memory plane in the second direction, forming first electrically conductive contacts connecting the word lines to the first electrodes, and forming second electrically conductive contacts connecting the bit lines to the second electrodes.

According to another aspect, a memory device is provided which may include, within an interconnect portion of an integrated circuit, at least one capacitive memory cell including a first electrode and a second electrode separated by a dielectric region. According to one aspect, the first electrode may comprise a conductive pad of square or rectangular shape, and the device may further include a stack of a dielectric layer and a conductive layer forming a band extending over and on each side of the pad. The second electrode may be formed by the zone of the second conductive layer facing the pad.

According to one example embodiment, the memory device may include, within the interconnect portion of the integrated circuit, a memory plane including capacitive memory cells extending in orthogonal first and second directions and each including a first electrode, a dielectric region and a second electrode. The memory plane may include conductive pads of square or rectangular shape forming the first electrodes. The stack of the dielectric layer and the second conductive layer may cover the pads in the first direction and form, in the second direction, conductive bands extending over and between the pads. The second electrodes may be formed by zones of the second bands facing the pads.

According to one example embodiment, the memory may further include word lines traversing the memory plane in the first direction and bit lines traversing the memory plane in the second direction, first electrically conductive contacts connecting the word lines to the first electrodes, and second electrically conductive contacts connecting the bit lines to the second electrodes.

BRIEF DESCRIPTION OF THE DRAWINGS

Other advantages and features will become apparent upon examining in detail completely nonlimiting embodiments and methods of implementation, and the appended drawings, in which.

DETAILED DESCRIPTION

Figure 1:
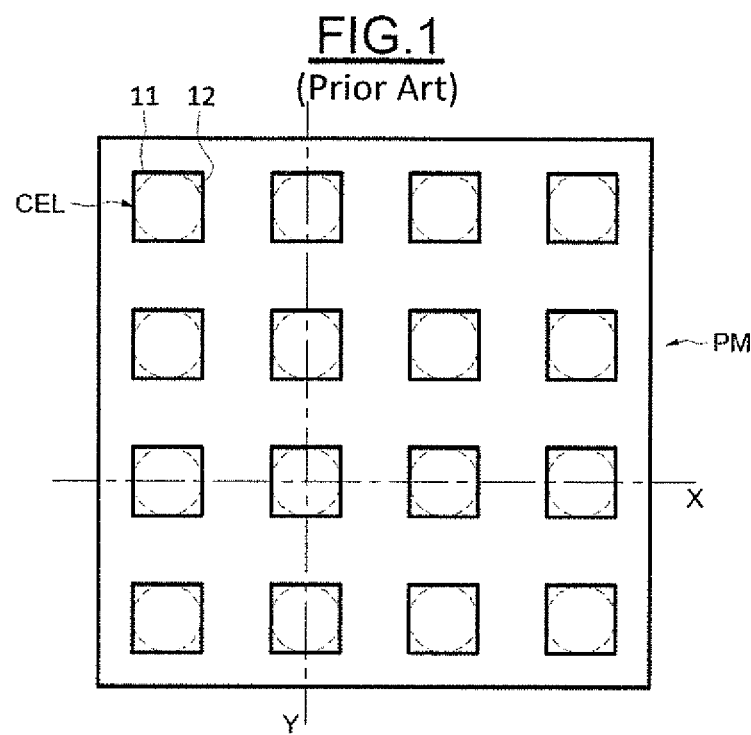
FIG. 1 illustrates a resist mask used in conventional processes for forming resistive memory.
Figure 2:
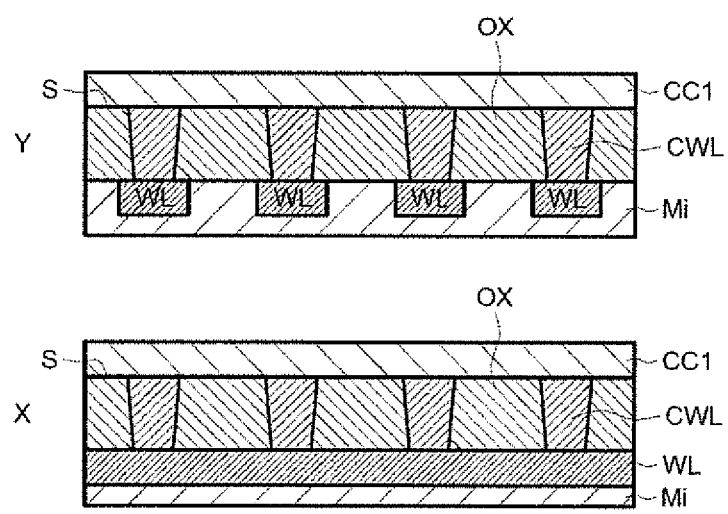
FIGS. 2, 4, 6 and 7 show cross-sectional views X and Y of structures obtained in various steps for forming an RRAM resistive-memory memory plane in accordance with an example embodiment, in planes parallel to a first direction X and to a second direction Y that are, for example, respectively longitudinal and traverse (the directions X, Y for example respectively correspond to the future rows and columns of the memory plane PM)

The cross-sectional views X and Y in FIG. 2 show an example BEOL interconnect structure including a metallization level Mi from which capacitive memory cells of the memory plane will be formed.

The BEOL interconnect portion is generally formed above an electronic circuit fabricated in and on a semiconductor substrate and includes a plurality of successive metallization levels. The resistive memory cells are, for example, formed between two metallization levels Mi and Mi+1. The metallization level Mi is shown very schematically and includes metal tracks forming word lines WL extending in the first direction X.

In an initial step, first electrically conductive contacts CWL, which may be formed in a conventional way, are connected to the word lines and have been formed in a dielectric layer OX deposited above the metallization level Mi. The surface S of the dielectric OX typically includes the contacts CWL which are planarized, such as by wet chemical-mechanical planarization, for example.

In accordance with an example process for forming a RRAM resistive-memory memory plane, a first conductive layer CC1 (which will eventually serve to form the first electrodes BE of the MOM capacitive structures) is deposited on the surface S. The first electrodes BE are the lower electrodes of the MOM capacitive structure, i.e., the electrodes closest to the substrate of the integrated circuit. The metal used to form the bottom electrodes BE may be chosen from titanium Ti, titanium nitride TiN, or a noble metal such as platinum Pt or iridium Ir, for example.

Figure 3:
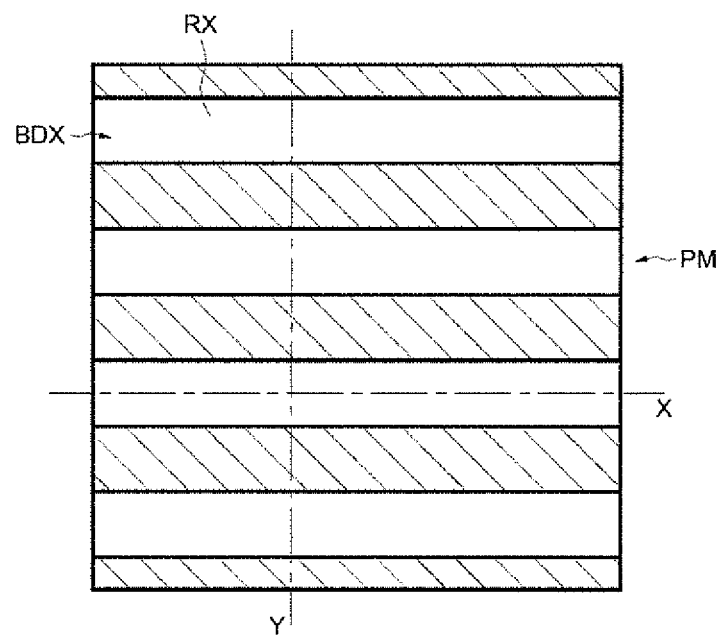
FIGS. 3 and 5 are top views of the resist masks deposited on a memory plane during RRAM resistive-memory formation in accordance with the example embodiment, in which the first and second directions X and Y have been shown.

In a following step, a layer of photoresist is deposited on the first layer CC1 and subjected to a conventional photolithography and etching phase to form longitudinal bands of resist RX. FIG. 3 shows the bands of resist RX extending parallel to the direction X and distributed periodically in a direction perpendicular to the direction X. The bands of resist, which are of the same width as one another, are repeated with a regular pitch and are placed facing contacts CWL.

Figure 4:
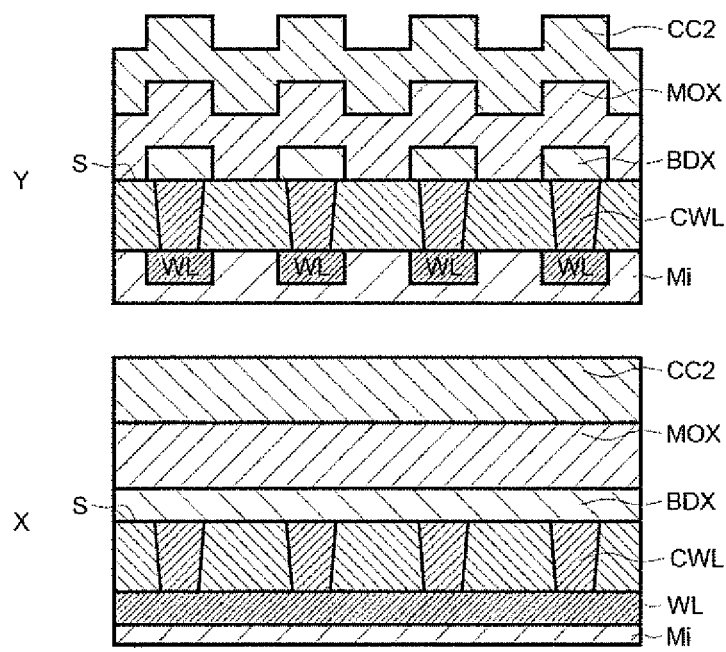

Next, the exposed portion of the first conductive layer CC1 is etched selectively relative to the resist RX and as far as the surface of the dielectric OX to obtain, after removal of the resist, bands BDX extending in the first direction X of the future memory plane (FIG. 4). During this step, no problem with resist adhesion is encountered. More specifically, the resist pattern takes the form of bands having a contact area which is larger than for a pattern made up of pads, and does not include corners that risk being rounded. The resist is then selectively removed to clear the structure obtained for implementing the subsequent steps of the process.

FIG. 4 shows a subsequent step of the process, in which a dielectric layer MOX and then a second conductive layer CC2 are deposited. The second conductive layer CC2 will eventually include the second electrodes TE of the capacitive cells CEL, and may also be formed from Ti, TiN or Pt. The second electrodes TE are the upper electrodes of the capacitive cells CEL, i.e., the electrodes furthest from the substrate. The dielectric layer MOX is advantageously a metal oxide, e.g., including titanium oxide $TiO_x$ or hafnium dioxide $HfO_2$.

Figure 5:
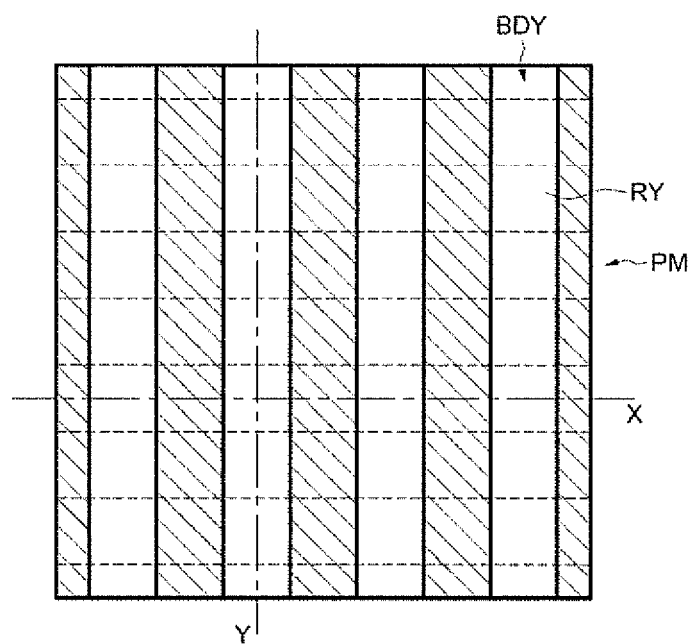

In a following step of the process, a photoresist layer is once again deposited and subjected to a photolithography and etching phase to form transverse bands of resist RY perpendicular to the longitudinal bands RX obtained beforehand. FIG. 5 shows the bands of resist RY on the surface of the structure, including a stack of the dielectric layer MOX and the second conductive layer CC2 on the first conductive layer CC1 and on the surface S of the dielectric layer OX.

The bands of resist RY extend parallel to the axis Y and are periodically distributed in the direction X. The bands of resist RY are also of the same width as one another, repeated with a regular pitch and placed facing contacts CWL.

Figure 6:
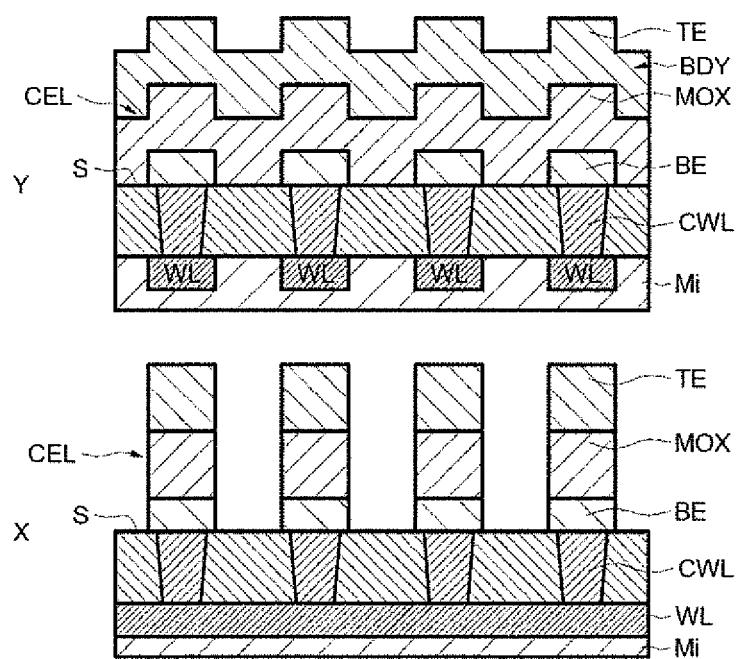

In a next step, the results of which are shown in FIG. 6, the second conductive layer CC2, the dielectric layer MOX and the first conductive layer CC1 are etched in succession and selectively relative to the resist as far as the surface S of the oxide layer OX. Thus, the etching of the first conductive layer CC1 through two perpendicular masks RX, RY results in first electrodes BE of square or rectangular shape, without rounding of the corners.

The dielectric layer MOX and the second conductive layer CC2 have a configuration in bands BDY, corresponding to the pattern of the mask RY, and form chevron-like shapes the teeth of which facing the first electrodes BE form the second electrodes (or upper electrodes) TE of the memory cells.

As described below with reference to FIG. 7, the second electrodes TE of the memory cells belonging to a given column will eventually be connected together by a bit line. The aspect ratio of the MOM capacitive cells is thus mainly defined by the shape of the pads forming the first electrodes BE. Since the pads are obtained by etching perpendicular bands, this process allows such an aspect ratio to be preserved for small dimensions.

Figure 7:
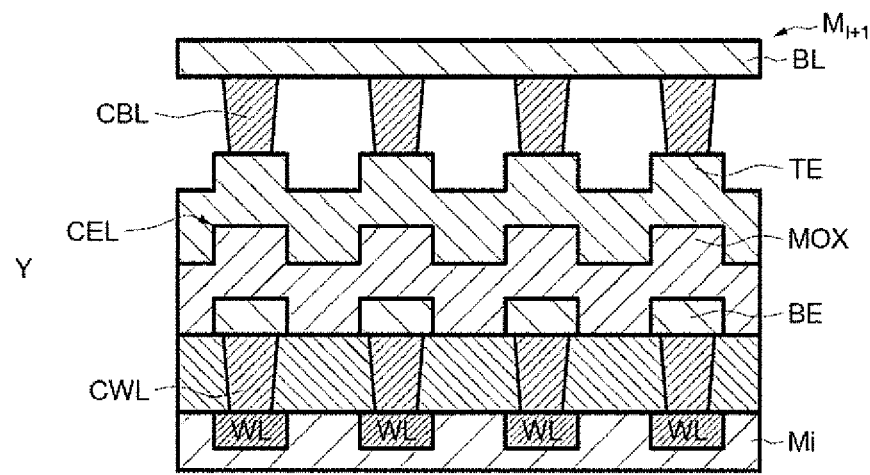
Figure 7:
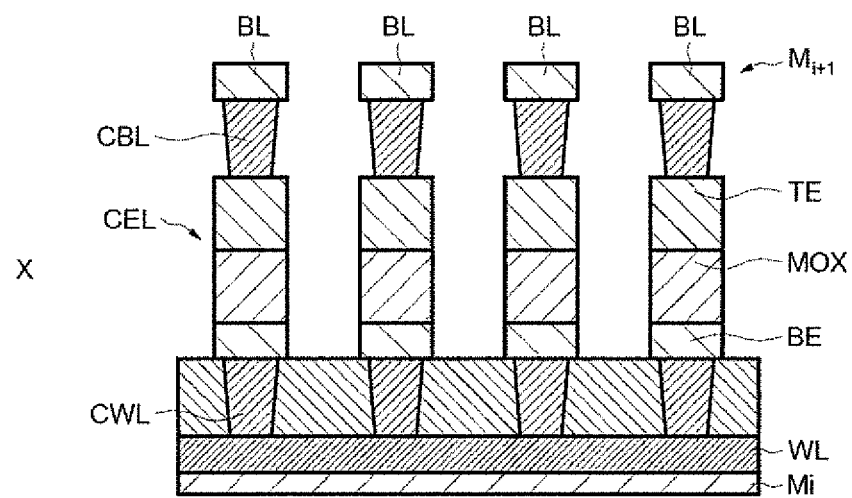

As FIG. 7 shows, bit lines BL extending in the transverse direction Y are formed in a conventional way, forming the columns of the memory plane PM. The bit lines are connected to each top electrode TE of a column of the memory plane PM by second contacts CBL.

The bit lines BL may, for example, be produced in the upper metallization level Mi+1. The second contacts CBL are thus produced between the metallization level Mi+1 and the second electrodes of the capacitive cells CEL. For the sake of clarity, no layer of insulating material, customarily placed between the capacitive structures CEL and between the contacts CBL, has been shown.

Thus, a memory plane including conductive pads of a square or rectangle shape forming the first electrodes BE has been obtained. A stack of a dielectric layer MOX and a second conductive layer covers the pads BE in the first direction X and forms in the second direction Y conductive bands BDY extending over the pads and between the pads. The second electrodes TE are thus formed by zones of the second bands BDY, vertically facing the pads. Of course, the memory device may also include conventional selection transistors for selecting memory cells, which are not shown here for the sake of simplicity.

The methods of implementation and embodiments of the invention are not limited to the present description but include other embodiments. For example, a process for producing a memory plane has been detailed, but the invention may also be applied to the production of a single isolated memory cell. Those skilled in the art will be able to adapt the teachings of the present description to implement such an embodiment.

The invention claimed is:

1. A device, comprising:
   a plurality of first electrodes arranged in a plurality of rows extending along a first direction and a plurality of columns extending along a second direction that is transverse to the first direction;
   a plurality of first dielectric layers extending along the second direction, each of the first dielectric layers extending over a respective column of the first electrodes;
   a plurality of second electrodes extending along the second direction, each of the second electrodes extending over a respective one of the plurality of first dielectric layers;
   a plurality of word lines extending along the first direction;
   a second dielectric layer on the plurality of word lines; and
   a plurality of first conductive contacts extending through the second dielectric layer, the first electrodes being electrically coupled to the word lines by the first conductive contacts.

2. The device of claim 1 wherein the first dielectric layers include at least one of titanium oxide or hafnium dioxide.

3. The device of claim 1,
   wherein each of the first electrodes of a respective row is electrically coupled to same one of the plurality of word lines.

4. The device of claim 3 wherein each of the first electrodes of a respective column is electrically coupled to a different one of the plurality of word lines.

5. The device of claim 1, further comprising:
   a plurality of bit lines extending along the second direction; and
   a plurality of second conductive contacts, the second electrodes being electrically coupled to the bit lines by the second conductive contacts.

6. The device of claim 5 wherein each of the bit lines is electrically coupled to a corresponding second electrode by two or more of the second conductive contacts.

7. The device of claim 1 wherein the first electrodes include at least one of titanium (Ti), titanium nitride (TiN), platinum (Pt), or iridium (Jr).

8. The device of claim 1 wherein the second electrodes include at least one of titanium (Ti), titanium nitride (TiN), platinum (Pt), or iridium (Jr).

9. The device of claim 1 wherein the second direction is orthogonal to the first direction.

10. A memory device, comprising:
    a substrate;
    a first conductive layer including a first electrode pad and a second electrode pad separated from the first electrode pad along a first direction, the first and second electrode pads each having a first side on the substrate, the first sides of each of the first and second electrode pads being rectangular;
    a band covering the first and second electrode pads, the band including a dielectric layer and a second conductive layer on the first and second electrode pads;
    a first memory cell including the first electrode pad, the dielectric layer, and the second conductive layer;
    a second memory cell including the second electrode pad, the dielectric layer, and the second conductive layer, wherein the first and second memory cells define a memory plane within an interconnect portion of the memory device, the memory plane including a plurality of memory cells extending in orthogonal first and second directions;
    word lines traversing the memory plane in the first direction;
    hit lines traversing the memory plane in the second direction;
    first electrically conductive contacts connecting the word lines to the first and second electrode pads; and
    a second electrically conductive contact connecting one of the bit lines to the second conductive layer.

11. The memory device of claim 10 wherein the band covers the first and second electrode pads in the first direction.

12. The memory device of claim 10 wherein the dielectric layer has a first side and a second side opposite the first side, the dielectric layer having a first thickness between the first and second sides of the dielectric layer at the first electrode pad and a second thickness between the first and second sides of the dielectric layer at a portion of the dielectric layer between the first and second electrode pads, the second thickness being different from the first thickness.

13. The memory device of claim 10 wherein the second conductive layer has a first side and a second side opposite the first side, the second conductive layer having a first thickness between the first and second sides of the second conductive layer at the first electrode pad and a second thickness between the first and second sides of the second conductive layer at the portion of the dielectric layer between the first and second electrode pads, the second thickness being different from the first thickness.

14. The memory device of claim 10 wherein the dielectric layer includes at least one of titanium oxide or hafnium dioxide.

15. The memory device of claim 10 wherein the first electrode pad includes at least one of titanium (Ti), titanium nitride (TiN), platinum (Pt), or iridium (Jr).

16. The memory device of claim 10 wherein the second electrode pad includes at least one of titanium (Ti), titanium nitride (TiN), platinum (Pt), or iridium (Jr).

17. An integrated circuit, comprising:
- a memory device having a first memory cell and a second memory cell, the memory device including:
- a first electrode pad;
- a second electrode pad spaced laterally apart from the first electrode pad;
- a dielectric layer covering the first and second electrode pads; and
- a third electrode on the dielectric layer and overlying the first and second electrode pads, wherein the first and second memory cells define a memory plane within an interconnect portion of the integrated circuit, the memory plane including a plurality of memory cells extending in orthogonal first and second directions;
- word lines traversing the memory plane in the first direction;
- bit lines traversing the memory plane in the second direction;
- first electrically conductive contacts connecting the word lines to the first and second electrode pads; and
- a second electrically conductive contact connecting one of the bit lines to the third electrode,
- wherein the first memory cell includes the first electrode pad, the dielectric layer, and the third electrode, and the second memory cell includes the second electrode pad, the dielectric layer, and the third electrode, and
- wherein the dielectric layer extends along the first direction.

18. The integrated circuit of claim 17 wherein the dielectric layer extends along the first direction.

19. The integrated circuit of claim 17 wherein the dielectric layer includes at least one of titanium oxide or hafnium dioxide.

20. The integrated circuit of claim 17 wherein the first and second electrode pads include at least one of titanium (Ti), titanium nitride (TiN), platinum (Pt), or iridium (Ir).

* * * * *

UNITED STATES PATENT AND TRADEMARK OFFICE
CERTIFICATE OF CORRECTION

PATENT NO. : 11,114,614 B2
APPLICATION NO. : 16/400649
DATED : September 7, 2021
INVENTOR(S) : Philippe Boivin It is certified that error appears in the above-identified patent and that said Letters Patent is hereby corrected as shown below:

In the Claims

Column 6, Claim 7, Line 12:
"(Jr)." should read: --(Ir).--.

Column 6, Claim 8, Line 15:
"(Jr)." should read: --(Ir).--.

Column 6, Claim 10, Line 42:
"hit" should read: --bit--.

Column 7, Claim 15, Line 6:
"(Jr)." should read: --(Ir).--.

Column 7, Claim 16, Line 9:
"(Jr)." should read: --(Ir).--.

Signed and Sealed this
Twenty-fourth Day of May, 2022

Katherine Kelly Vidal
*Director of the United States Patent and Trademark Office*